(12) United States Patent
Buchholz et al.

(10) Patent No.: US 9,281,360 B1
(45) Date of Patent: Mar. 8, 2016

(54) SEMICONDUCTOR DEVICE WITH A SHIELDING STRUCTURE

(71) Applicant: Infineon Technologies AG, Neubiberg (DE)

(72) Inventors: Karin Buchholz, Munich (DE); Matteo Dainese, Villach (AT); Elmar Falck, Hohenbrunn (DE); Hans-Joachim Schulze, Taufkirchen (DE); Gerhard Schmidt, Wernberg (AT); Frank Umbach, Munich (DE)

(73) Assignee: Infineon Technologies AG, Neubiberg (DE)

( * ) Notice: Subject to any disclaimer, the term of this patent is extended or adjusted under 35 U.S.C. 154(b) by 8 days.

(21) Appl. No.: 14/457,491

(22) Filed: Aug. 12, 2014

(51) Int. Cl.
| | |
|---|---|
| *H01L 29/02* | (2006.01) |
| *H01L 29/06* | (2006.01) |
| *H01L 29/40* | (2006.01) |

(52) U.S. Cl.
CPC .......... *H01L 29/0615* (2013.01); *H01L 29/063* (2013.01); *H01L 29/0619* (2013.01); *H01L 29/404* (2013.01)

(58) Field of Classification Search
CPC ........................ H01L 29/0619; H01L 29/404
USPC .................................................. 257/409, 490
See application file for complete search history.

(56) References Cited

U.S. PATENT DOCUMENTS

| | | |
|---|---|---|
| 5,086,332 A | 2/1992 | Nakagawa et al. |
| 5,087,959 A | 2/1992 | Omori et al. |
| 8,476,691 B1 * | 7/2013 | Sdrulla ................. H01L 29/405 257/314 |
| 2013/0341751 A1* | 12/2013 | Ono ........................ H01L 23/58 257/488 |
| 2015/0187870 A1* | 7/2015 | Agata ................... H01L 29/404 257/409 |

FOREIGN PATENT DOCUMENTS

DE    102004057792 A1    6/2006

OTHER PUBLICATIONS

Yilmaz, et al., "Floating Metal Rings (FMR), a Novel High-Voltage Blocking Technique", IEEE Electron Device Letters, vol. EDL-6, No. 11, Nov. 1985, pp. 600-601.

* cited by examiner

*Primary Examiner* — David Vu
*Assistant Examiner* — Brandon Fox
(74) *Attorney, Agent, or Firm* — Murphy, Bilak & Homiller, PLLC

(57) ABSTRACT

A semiconductor device has a semiconductor body including opposing bottom and top sides, a surface surrounding the semiconductor body, an active semiconductor region formed in the semiconductor body, an edge region surrounding the active semiconductor region, a first semiconductor zone of a first conduction type formed in the edge region, an edge termination structure formed in the edge region at the top side, and a shielding structure arranged on that side of the edge termination structure facing away from the bottom side. The shielding structure has a number of $N1 \geq 2$ first segments and a number of $N2 \geq 1$ second segments. Each of the first segments is electrically connected to each of the other first segments and to each of the second segments, and each of the second segments has an electric resistivity higher than an electric resistivity of each of the first segments.

25 Claims, 8 Drawing Sheets

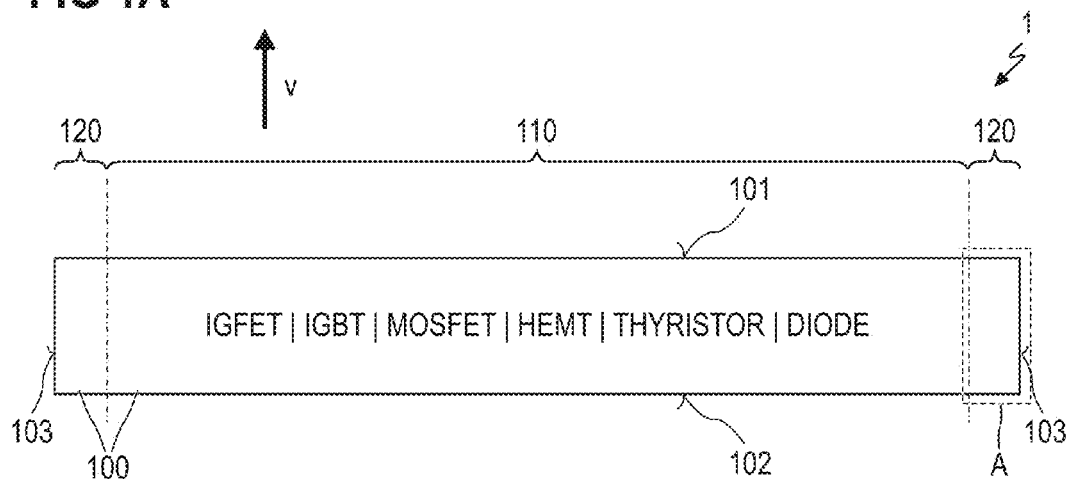
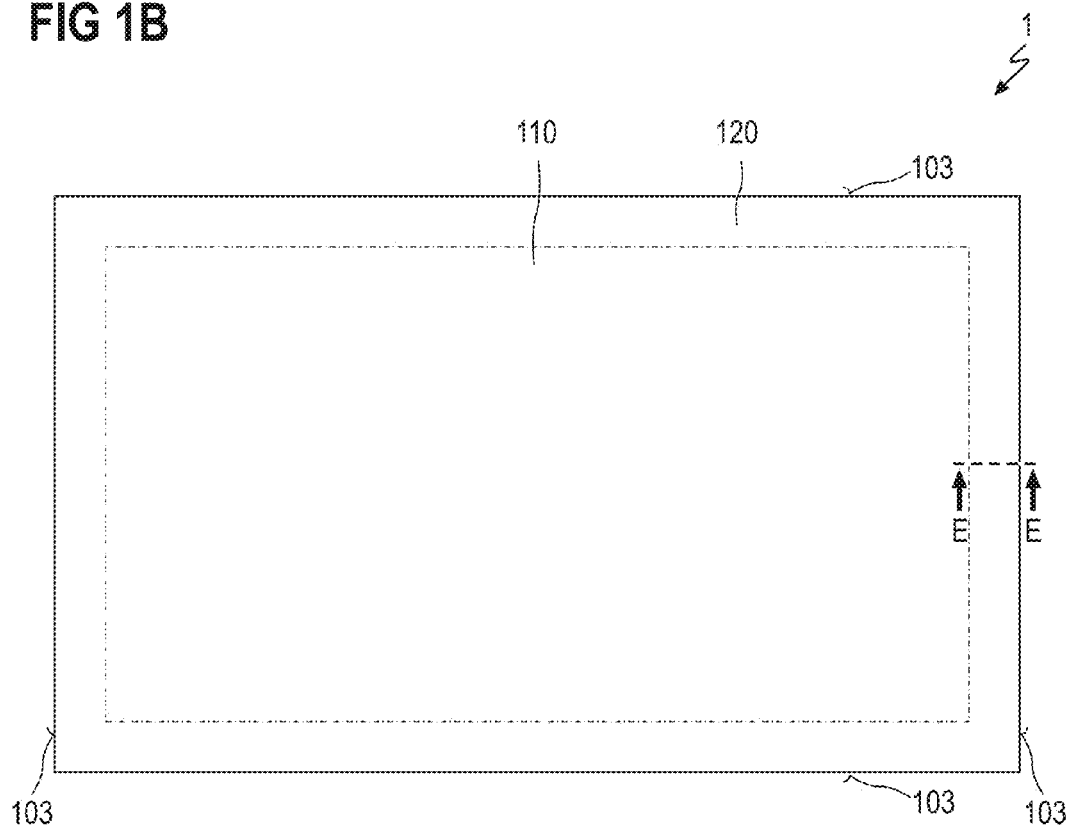

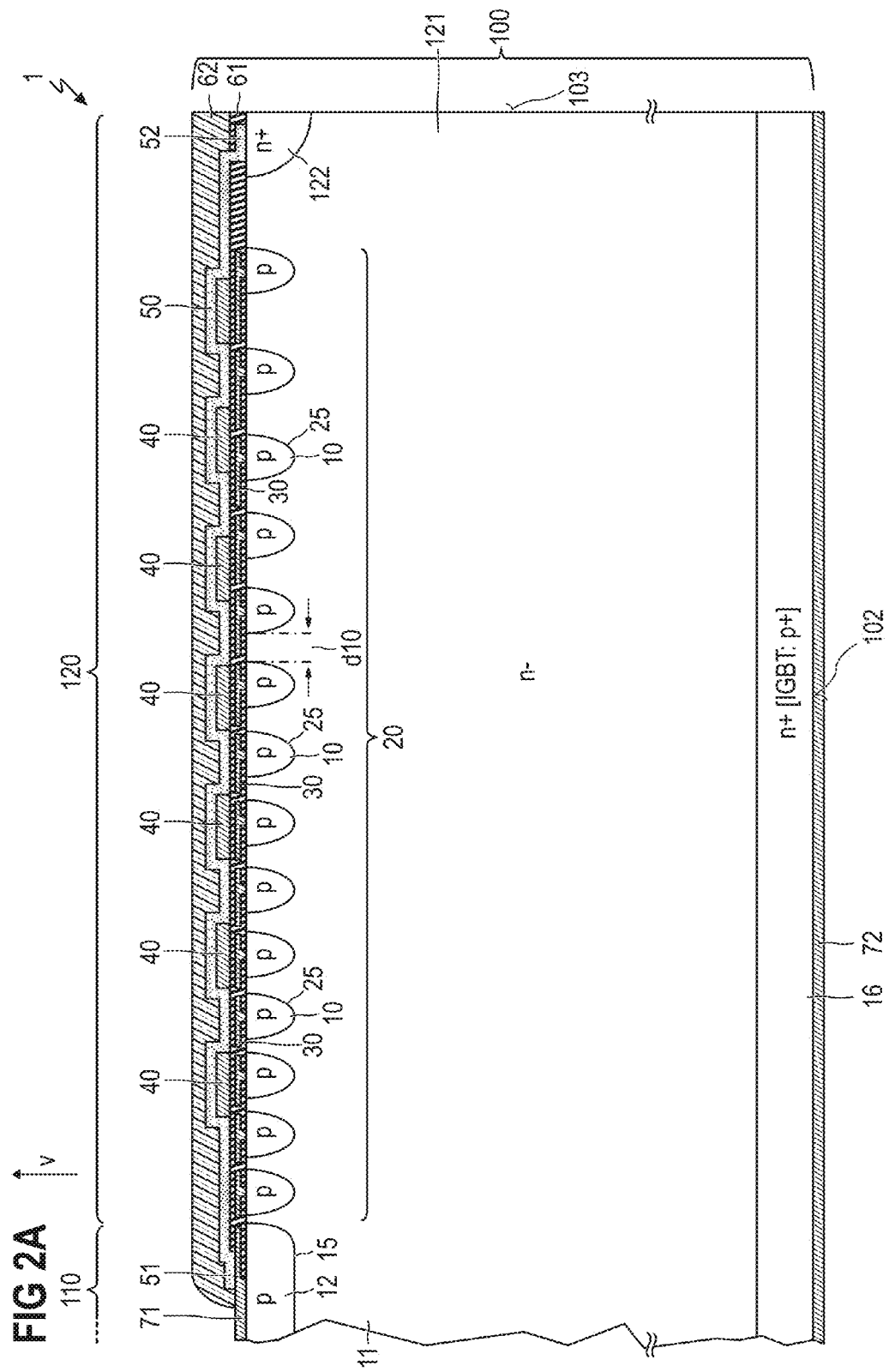

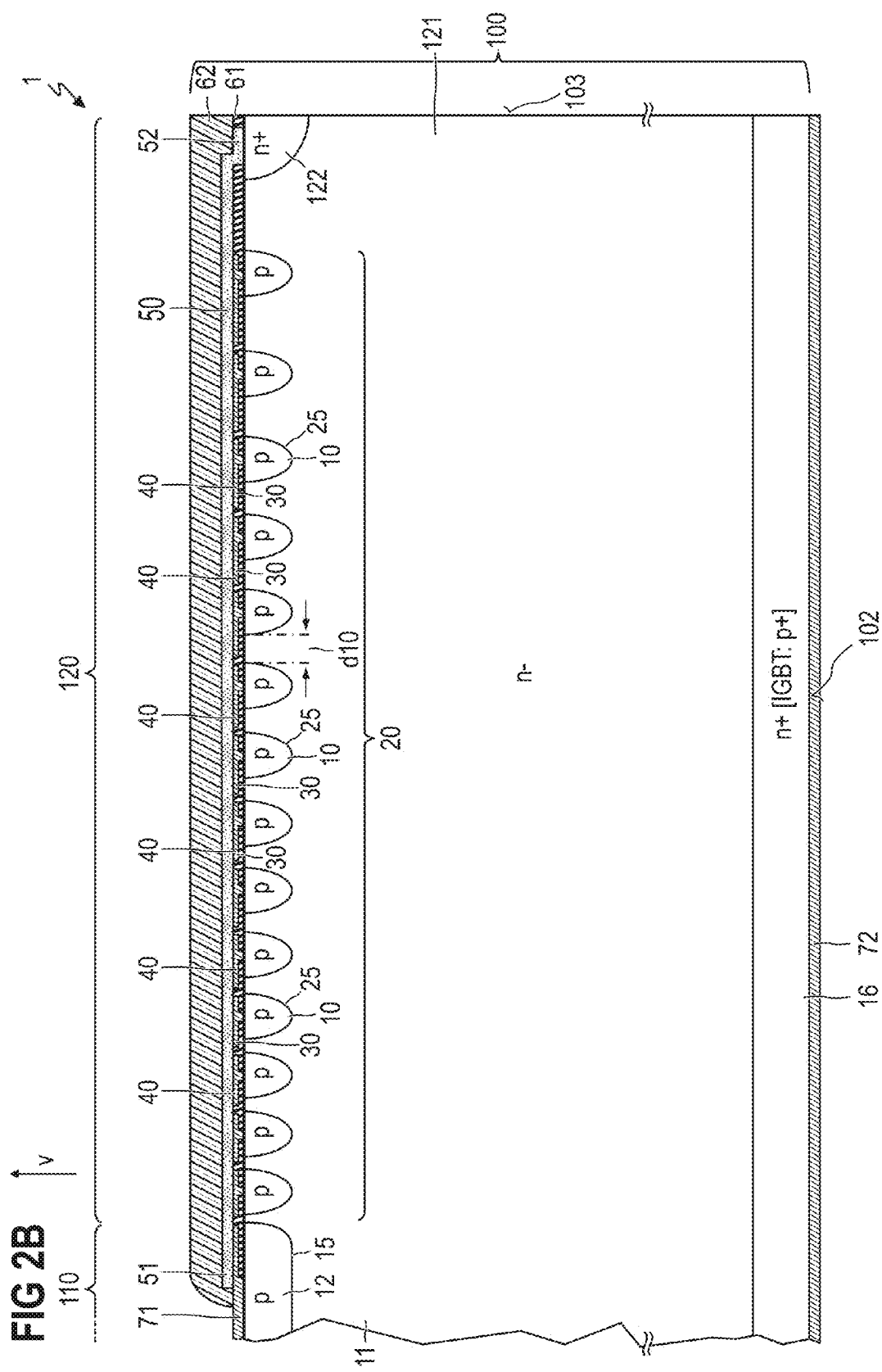

SEMICONDUCTOR DEVICE WITH A SHIELDING STRUCTURE

TECHNICAL FIELD

Embodiments of the present invention relate to a semiconductor device with a field ring or a JTE (junction termination extension) or a VLD (VLD=variation of lateral doping) edge termination structure.

BACKGROUND

Power semiconductor devices, such as power diodes, power MOSFETs, power IGBTs, or any other power semiconductor devices are designed to withstand high blocking voltages, e.g. at least 600 V. Those power devices include a pn-junction that is formed between a p-doped semiconductor region and an n-doped semiconductor region. The device is in its blocking mode when the pn-junction is reversely biased. In this case a depletion region (space charge region) propagates in the p-doped and n-doped regions. Usually, one of these n-doped and p-doped semiconductor regions is more lightly doped than the other one of these semiconductor regions, so that the depletion region mainly extends in the more lightly doped region, which mainly supports the voltage applied across the pn-junction.

The ability of a pn-junction to support high voltages is limited by the avalanche breakdown mechanism of the semiconductor power device. As a blocking voltage applied to a pn-junction increases, an electric field in the semiconductor regions forming the pn-junction also increases. The electric field results in an acceleration of mobile charge carriers present in the semiconductor region. An avalanche breakdown occurs when, due to the electric field, the charge carriers are accelerated such that they create electron-hole pairs by impact ionization. Charge carriers created by impact ionization create new charge carriers, so that there is a multiplication effect. At the onset of an avalanche breakdown, a significant current flows across the pn-junction in the reverse direction. The voltage at which the avalanche breakdown sets in is referred to as breakdown voltage.

The electric field at which the avalanche breakdown sets in is referred to as critical electric field ($E_{crit}$). The absolute value of the critical electric field is mainly dependent on the type of semiconductor material used for forming the pn-junction, and is (weakly) dependent on the doping concentration of the more lightly doped semiconductor region.

The critical electric field is a theoretical value that is defined for a semiconductor region that has an infinite size in directions perpendicular to field strength vectors of the electric field. Power semiconductor devices, however, have a semiconductor body of finite size that is terminated by edge surfaces in lateral directions. In vertical power semiconductor devices, which are semiconductor devices in which the pn-junction mainly extends substantially in a horizontal plane of the semiconductor body, the pn-junction usually does not extend to the edge surface of the semiconductor body but is distant to the edge surface of the semiconductor body in a lateral direction. In this case, a semiconductor region (edge region) of the semiconductor body adjoining the pn junction in the lateral direction also has to withstand the blocking voltage.

In the edge region, an edge termination structure can be implemented that helps to improve the voltage blocking capability in the edge region. Nevertheless, it is desirable to further improve the voltage blocking capability.

SUMMARY

According to one aspect of the invention, a semiconductor device has a semiconductor body with a top side, a bottom side opposite the top side, and a surface limiting the semiconductor body. An active semiconductor region and an edge region are formed in the semiconductor body. The edge region surrounds the active semiconductor region. A first semiconductor zone of a first conduction type is formed in the edge region. Further, an edge termination structure is formed in the edge region at the top side. On that side of the edge termination structure facing away from the bottom side, a shielding structure comprising a number of $N1 \geq 2$ first segments and a number of $N2 \geq 1$ second segments are arranged. Each of the first segments is electrically connected to each of the other first segments and to each of the second segments. Each of the second segments has an electric resistivity higher than an electric resistivity of each of the first segments.

As discovered by the inventors of the present invention, the shielding structure serves to trap surface charges that, for instance, emanate from outside the semiconductor device. The second segment(s) having an electric resistivity higher than an electric resistivity of each of the first segments serves to bleed off the collected charge carriers in a controlled manner. As the number of charge carriers that adversely affect the voltage blocking capability increasing effect of the edge termination structure is significantly reduced, the voltage blocking capability of the semiconductor device is stabilized.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 1A schematically illustrates a vertical cross-sectional view of a semiconductor device with a semiconductor body having an active semiconductor region and an edge region surrounding the semiconductor region.

FIG. 1B schematically illustrates a top view of the semiconductor device of FIG. 1A.

FIG. 2A illustrates a cross-sectional side view of a first embodiment of a semiconductor device according to FIGS. 1A and 1B in a sectional plane E-E, wherein the edge termination structure has a number of field rings and optional field plates.

FIG. 2B illustrates a modification of the first embodiment, in which modification the field plates are formed by the first segments.

DETAILED DESCRIPTION

Figure 3:
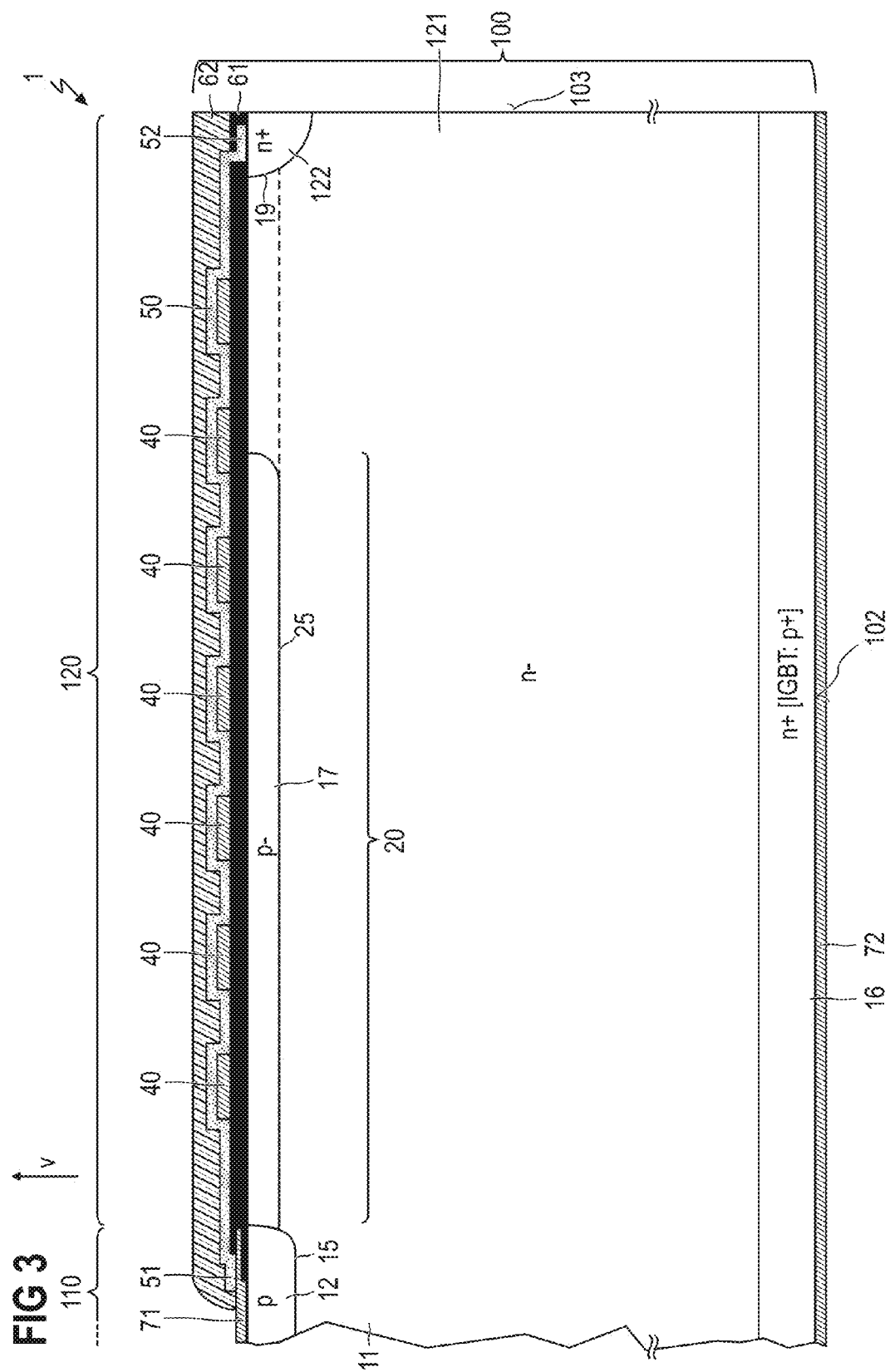
FIG. 3 illustrates a cross-sectional side view of a second embodiment of a semiconductor device according to FIGS. 1A and 1B in a sectional plane E-E, wherein the edge termination structure has junction termination extension.

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

FIGS. 1A and 1B schematically illustrate a semiconductor body 100 of a power semiconductor device 1. FIG. 1A is a side view and FIG. 1B a top view. The semiconductor body 100 has a top side 101, a bottom side 102 opposite the top side 101, and a surface 103. The top side 101 is arranged distant from the bottom side 102 in a vertical direction v that runs perpendicular to the bottom side 102. For the sake of clearness, metallizations, electrodes, dielectric layers etc. arranged on the semiconductor body 100 and the detailed internal structure are suppressed in FIGS. 1A and 1B and will be explained with reference to further FIGS. 2A, 2B and 3 to 9.

The semiconductor body 100 has an active semiconductor region 110, and an edge region 120 surrounding the active semiconductor region 110. The surface 103 which may substantially extend perpendicular to the bottom side 102, is a closed ring surrounding both the active semiconductor region 110 and the edge region 120. That is, the edge region 120 is arranged between the active semiconductor region 110 and the surface 103.

The semiconductor body 100 includes an arbitrary material, for instance a single-element semiconductor material, e.g. silicon (Si), germanium (Ge), or a compound semiconductor material, e.g. IV-IV or III-V or III-VI or II-VI or IV-VI or I-III-VI semiconductor material.

Suitable IV-IV semiconductor materials are SiC or SiGe. Suitable III-V semiconductor materials are GaP, GaAs, InP, InSb, InAs, GaSb, GaN, AlN, InN, $Al_xGa_{1-x}As$ ($0 \le x \le 1$) or $In_xGa_{1-x}N$ ($0 \le x \le 1$). Suitable II-VI semiconductor materials are ZnO, ZnS, ZnSe, ZnTe, CdS, CdSe, CdTe, $Hg_{1-x}Cd_xTe$ ($0 \le x \le 1$), BeSe, BeTe or HgS. Suitable III-VI semiconductor materials are GaS, GaSe, GaTe, InS, InSe, InTe. Suitable I-III-VI semiconductor materials are $CuInSe_2$, $CuInGaSe_2$, $CuInS_2$, CuIn, $GaS_2$. A suitable IV-VI semiconductor material is SnTe.

The semiconductor body 100 may have a substantially monocrystalline structure. However, the semiconductor body 100 may also have a small number of crystallographic defects like point defects, line defects, planar defects, bulk defects. In contrast, a body formed of polycrystalline semiconductor material, e.g. polycrystalline silicon, has a large number of crystallographic defects.

In order to realize an electronic structure monolithically integrated in the semiconductor body 100 and having an arbitrary function, the semiconductor body 100 may have any combination of doped and/or undoped crystalline semiconductor material, doped and/or undoped polycrystalline semiconductor material like polycrystalline silicon or polycrystalline silicon carbide, p-conductive semiconductor regions, n-conductive semiconductor regions, trenches, metallization layers, dielectric layers, semiconductor resistance regions, pn-junctions and so on.

The semiconductor component 1 may also comprise arbitrary electrically conductive layers or elements applied to the semiconductor body 100, for instance metals, polycrystalline semiconductor material (e.g. polycrystalline silicon or polycrystalline silicon carbide), silicide layers or elements, dielectric layers or elements like nitride (e.g. silicon nitride), oxides (e.g. silicon oxide) or imides.

For instance, the electronic structure may consist of or include a transistor, e.g. a bipolar or an unipolar transistor like an IGFET (Insulated Gate Field Effect Transistor), e.g. a MOSFET (Metal Oxide Field Effect Transistor), an IGBT (Insulated Gate Bipolar Transistor), a JFET (Junction Field Effect Transistor), a HEMT (High Electron Mobility Transistor), a thyristor, a BJT (bipolar junction transistor), or a diode. Optional, the electronic structure may have a cellular structure with a plurality of device cells, e.g. transistor cells, electrically connected in parallel. For instance, the device cells may be, without limitation, stripe cells, rectangular cells, square cells or hexagonal cells.

FIG. 2A is an enlarged cross-sectional view of a section of the semiconductor device of FIGS. 1A and 1B in a sectional plane E-E. Only for illustration purposes, the semiconductor device 1 is a MOSFET or an IGBT the structure of which is well-known in the art. However, the edge region 120 described with reference to FIG. 2A may be used in connection with any other electronic structure described above.

The active semiconductor region 110 has a rectifying main junction 15 which is arranged in the active semiconductor region 110. The rectifying main junction 15 is a pn-junction formed between a first main semiconductor region 11 and a second main semiconductor region 12. The first main semiconductor region 11 and the second main semiconductor region 12 have complementary conduction types. As illustrated in FIG. 2A, the first main semiconductor region 11 may be of the n-type and the second main semiconductor region 12 of the p-type. However, the first main semiconductor region 11 may also be of the p-type and the second main semiconductor region 12 of the n-type.

As in all other embodiments of the present invention, the rectifying main junction 15 could—as an alternative to a pn-junction—also be a Schottky junction. In this case, there would not be a second semiconductor region 12. Instead, the first main semiconductor region 11 would also include the region of the second semiconductor region 12. That is, the first semiconductor region 11 would extend as far as the top side 101 where it would contact a first main electrode 71 that is arranged on the top side. The rectifying main-junction would be formed as a Schottky junction between the first main semiconductor region 11 and the first main electrode 71.

As is also illustrated in the present embodiment, the first main semiconductor region 11 may comprise a drift zone of the semiconductor device 1. The doping concentration of the first main semiconductor region 11 is not required to be constant in the vertical direction v. For instance, the first main semiconductor region 11 may have at least one sub-region in which the doping concentration of the first main semiconductor region 11 has, in the vertical direction v, a local or even global maximum, whereby "global" refers to the whole first main semiconductor region 11. The local or global maximum may be arranged distant from the bottom side 102 or be located at the bottom side 102. For instance, such a sub-region may be a field stop zone or a contact region for improving an electrical contact to an electrode arranged on the semiconductor body 100.

In the illustrated embodiment of a MOSFET or an IGBT, a further semiconductor region 16 is arranged on that side of the drift zone 11 facing away from the top side 101. In case of a MOSFET the further semiconductor region 16 is a drain region having the first conduction type, in case of an IGBT, the further semiconductor region 16 is a collector region having the second conduction type. In both cases, the doping concentration of the further semiconductor region is greater than that of the drift zone 11.

As shown, the rectifying main junction 15 may run substantially parallel to the bottom side 102. In principle however, the rectifying main pn-junction 15 may have an arbitrary shape. In any case, an edge termination structure 20 arranged in the edge region 120 at the top side 101 as will be explained in more detail below serves to improve the voltage blocking capability in the edge region 120 if the rectifying main junction 15 is in its blocking state, that is, if the rectifying main junction 15 is reverse biased by a blocking voltage. For instance, the blocking voltage capability may be at least 100 V. However, the blocking voltage capability may also be lower.

The edge region 120 has a first semiconductor zone 121 of a first conduction type. Optionally, the first semiconductor zone 121 may be a sub-region of the first main semiconductor region 11 and accordingly have the conduction type of the first main semiconductor region 11. In the present embodiment, the first conduction type is "n". Alternatively, the first conduction type could also be "p".

According to a first embodiment of an edge termination structure 20, an edge termination structure 20 may have a field ring structure with at least N10 field rings 10. N10 is an integer with N10≥1. For instance, N10 may be at least 5 or at least 10 or at least 15. Each of the field rings 10 has a second conduction type (here: p) complementary to the first conduction type (here: n) and forms a pn-junction 25 with the first semiconductor zone 121. Further, each of the field rings 10 surrounds the active semiconductor region 110.

The field rings 10 may have an equidistant or, preferably, a non-equidistant spacing. In the latter case which is illustrated in FIG. 2A and considering all field rings 10 of the semiconductor device 1, within the edge region 120 the distances d10 between adjacent field rings 10 may increase from the active semiconductor region 110 towards the surface 103. Optionally, the distance d10 between a first one of the field rings 10 and a second one of the field rings 10 with no further field ring 10 arranged in between may be at least 5 µm and/or less than or equal to 500 µm.

Also optionally, one, more than one or each of the field rings 10 may be electrically connected to an electrically conductive field plate 30 that is arranged on the top side 101. Thereby, each of the field plates 30 may be electrically connected to one and only one of the field rings 10. In order to avoid the field plate(s) 30 from making contact with the first semiconductor zone 121, a dielectric 61 is arranged between the field plates(s) 30 and the top side 101. A protrusion of each field plate 30 pierces through the dielectric 61 toward the semiconductor body 100 and electrically contacts the respective field ring 10.

Above the field limiting structure 20, that is, on that side of the field limiting structure facing away from the bottom side 102, there is a shielding structure arranged on the top side 101. The shielding structure has a number of N1≥2 first segments 40 and a number of N2≥1 second segments 50. For instance, N1 may be at least 3, at least 10 or even at least 20. N2 may be equal to 1, or greater than one. Optionally, the semiconductor component may have one and only one second segment that is a continuous or non-continuous layer. Any two first segments 40 are arranged distant from one another. If there are more than one second segments 50, any two second segments 50 are arranged distant from one another. Further, the first segments 40 are arranged distant from the semiconductor body 100 with a dielectric 61 arranged between the field limiting structure 20 and the shielding structure. The embodiment illustrated in FIG. 2 has only one second segment 50.

Generally, each of the first segments 40 is electrically connected to at least one, more than one or all second segments 50. Thereby, each of the second segments 50 has an electric resistivity higher than an electric resistivity of each of the first segments 40.

Optionally, each of the second segments 50 may have an electric resistivity that is at least 10 times or even 100 times higher than an electric resistivity of each of the first segments 40. Also optionally, one, more than one or each of the first segments 40 may have an electric resistivity of less than 50 Ω·cm or even of less than 1 Ω·cm.

One, more than one or each of the first segments 40 may, independently from the other first segments 40, consist of or comprise metal, doped or undoped polycrystalline semiconductor.

Also optionally, one, more than one or each of the second segments 50 may have an electric resistivity of at least $10^8$ Ω·cm. For instance, one, more than one or each of the second segments 50 may consist of or comprise doped or undoped polycrystalline semiconductor material, amorphous semiconductor material (e.g. amorphous silicon "a-Si" or amorphous silicon carbide "a-SiC"), amorphous non-semiconductor material (e.g. amorphous carbon "a-C" or hydrogenated amorphous carbon "a-C:H").

According to a preferred embodiment, one, more than one or each of the first segments 40 may be formed as a closed ring. However, a plurality of other layouts is also possible. All first segments 40 which are formed as closed rings may be arranged such that there is only one (the innermost) among all of those closed rings that does not surround at least one of the other closed rings.

In order to allow for electrically connecting the rectifying main junction 15 to a device that is external to the semiconductor device 1, a first main electrode 71 and a second main electrode 72 with the rectifying main junction 15 electrically connected in series between the first main electrode 71 and the second main electrode 72 may be arranged on the semiconductor body 100. For instance, as illustrated in FIG. 2A, the first main electrode 71 may be arranged on the top side 101 and the second main electrode 72 on the bottom side 102 such that the semiconductor body 100 is arranged between the first main electrode 71 and the second main electrode 72. Such an arrangement may be used, inter alia, if the semiconductor device 1 is designed a "vertical" device, that is, in a device in which the main current substantially runs in the vertical direction v.

In particular, the first main electrode 71 and the second main electrode 72 may be an anode electrode and a cathode electrode or a cathode electrode and an anode electrode (e.g. if the semiconductor device 1 is a diode or a thyristor), or be an emitter electrode and a collector electrode or a collector electrode and an emitter electrode (if the semiconductor device 1 is a bipolar device like, e.g. an IGBT), or a source electrode and a drain electrode or a drain electrode and a source electrode (e.g. if the semiconductor device 1 is unipolar device like, e.g. a MOSFET).

As exemplarily shown in FIG. 2A, the shielding structure with its first and second segments 40, 50 may optionally be electrically connected at a first connection region 51 to the first main electrode 71 and/or at a second connection region 52 to a field stop or channel stop ring 122 that is arranged in the edge region 120 and that surrounds the active semiconductor region 110.

If the shielding structure is electrically connected to a first main electrode 71, the respective connection may be designed such that for each of the first segments 40 an electric resistance between that first segment 40 and the first main electrode 71 is at least 1 Ω.

If the shielding structure is electrically connected to a field stop ring 122, the respective connection may be designed such that for each of the first segments 40 an electric resistance between that first segment 40 and the field stop or channel stop ring 122 is at least 1 Ω.

Due to the high-ohmic connection(s) between the first segments 40 on the one hand and the first main electrode 71 and/or the field stop ring 122 on the other hand, charge carriers collected with the first segments 40 are bleed off in a controlled, limited manner to the first main contact 71 and/or the field stop ring 122, respectively.

FIG. 2B illustrates a modification of the semiconductor device 1 described with reference to FIG. 2A. In this modification, the first segments 40 also act as field plates 30 and therefore have a double function.

As already described above, the edge termination structure 20 is arranged in the edge region 120 at the top side 101. Thereby, the edge termination structure 20 may be arranged between a rectifying main junction 15 and the surface 103.

The edge termination structure 20 may be or have a planar edge termination structure. In this context, a "planar edge termination structure" is a structure having one or more wells of the second conduction type, for instance one or more field rings 10 as explained with reference to FIGS. 2A and 2B, a junction termination extension region 17 as explained with reference to FIG. 3 (described below in more detail), or a variable lateral doping region 18 as explained with reference to FIG. 4 (described below in more detail). In any case, the planar edge termination structure has at least one pn-junction 25. Each of the pn-junction(s) 25 of the planar edge termination structure is arranged distant from the edge 103.

Further, a dielectric passivation layer 62, e.g. an imide, may optionally be arranged on the top side 101 such that the first and second segments 40, 50 are completely embedded and do not have any exposed parts.

Figure 4:
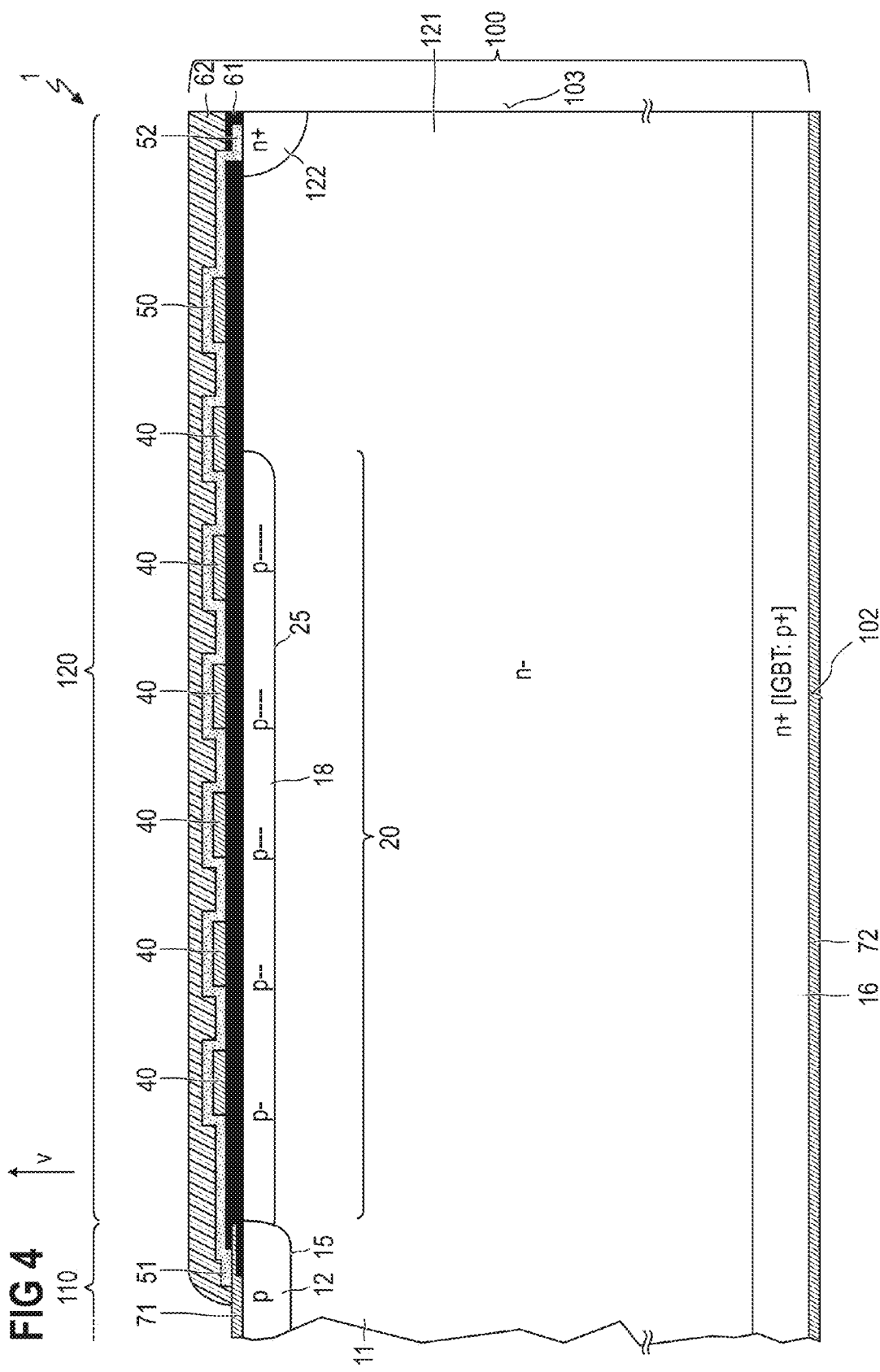
FIG. 4 illustrates a cross-sectional side view of a third embodiment of a semiconductor device according to Figures 1A and 1B in a sectional plane E-E, wherein the edge termination structure has variable lateral doping termination extension

FIGS. 2A, 2B, 3 and 4 each describes a semiconductor device 1 having a planar edge termination structure 20. In FIGS. 2A and 2B, the edge termination structure 20 has field rings 10 and optionally also field plates 30 as described above. Semiconductor devices 1 having other edge termination structures 20 will now be explained with reference to FIGS. 3 and 4. Apart from the different kinds of edge termination structures 20, the semiconductor devices 1 of FIGS. 3 and 4 are identical to the semiconductor device 1 of FIGS. 2A and 2B. Insofar, features explained with reference to FIGS. 2A and 2B may also apply to FIGS. 3 and 4.

In the semiconductor device 1 of FIG. 3, the planar edge termination structure 20 has a junction termination extension region 17 ("JTE") that is formed as a closed ring which surrounds the active semiconductor region 110. The junction termination extension region 17 has the second conduction type and directly adjoins the rectifying main junction 15 from which it extends perpendicular to the vertical direction towards the surface 103. The junction termination extension region 17 is characterized in that its doping concentration is—in a direction perpendicular to the vertical direction v and apart from edge effects—close to its boundary with the first semiconductor zone 121 and close to rectifying main junction 15 substantially constant. Optionally, as indicated by a dashed line, the region 17 may extend towards the edge 103 as far as the field stop region 122 so that a pn-junction 19 between the region 17 and the field stop region 122 is formed. In this case, the field stop region 122 is also designated as resurf region.

In the semiconductor device 1 of FIG. 4, the planar edge termination structure 20 has a variable lateral doping region 18 ("VLD") which differs from the described junction termination extension region 17 only in that its doping concentration varies, in a direction perpendicular to the vertical direction v, with increasing distance from the rectifying main junction 15.

Figure 5:
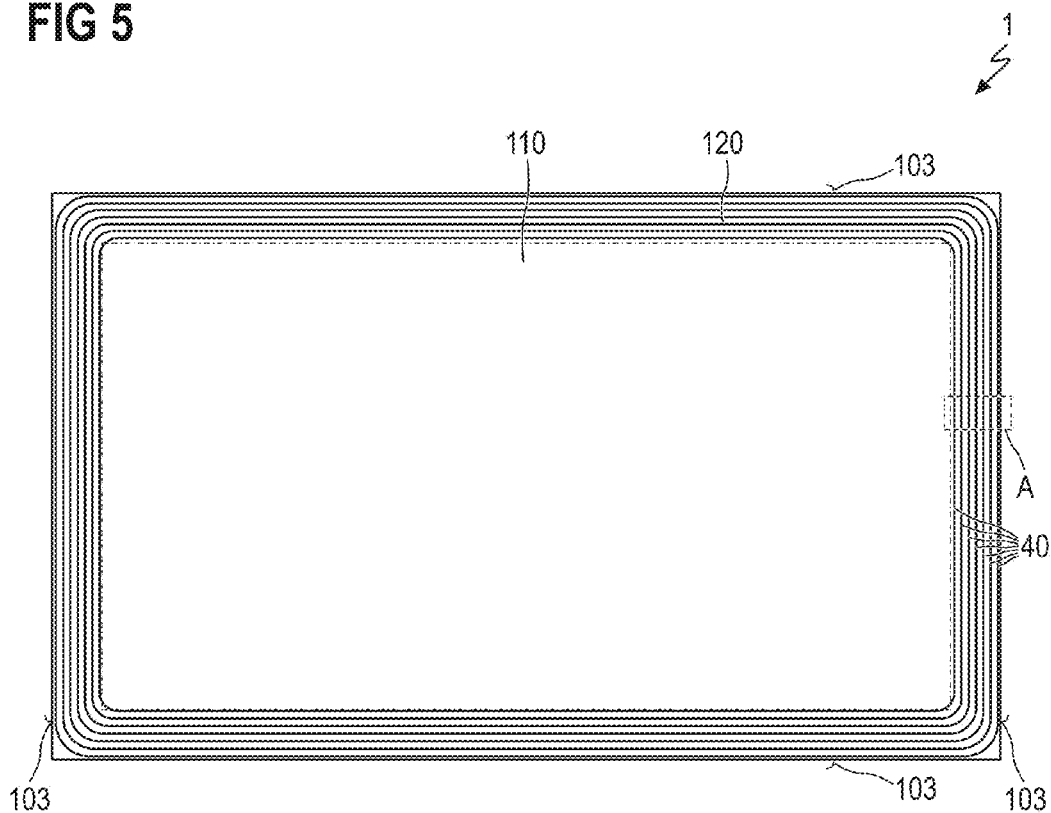
FIG. 5 is a top view of a semiconductor device as illustrated in FIGS. 1A and 1B which schematically illustrates a possible layout of the first segments

FIG. 5 is a top view of a semiconductor device as illustrated in FIGS. 1A and 1B which schematically illustrates a possible layout of the first segments 40. Such a layout may be used in connection with any semiconductor device 1 of the present invention, in particular in connection with the embodiments described with reference to FIGS. 2A, 2B, 3 and 4. In order to show that each of the first segments 40 may be a closed ring, the dielectric passivation layer 62 and the second segments 50 are removed. It is also apparent from FIG. 5 that the surface 103 is ring-shaped, surrounds the active semiconductor region 110 and delimits the semiconductor body 100.

Figure 6:
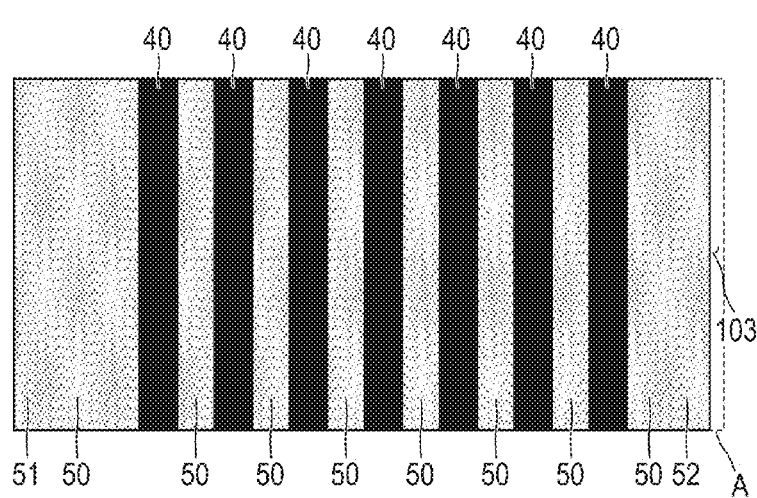
FIG. 6 illustrates an enlarged section A of the semiconductor device of FIG. 5, wherein each of the second segments is formed as a ring that is arranged between and electrically interconnects the two adjacent first segments.

An enlarged section A which additionally shows the second segments 50 is illustrated in FIG. 6. Each of the second segments 50 is formed as a ring that is arranged between and electrically interconnects two adjacent first segments 40.

Figure 7:
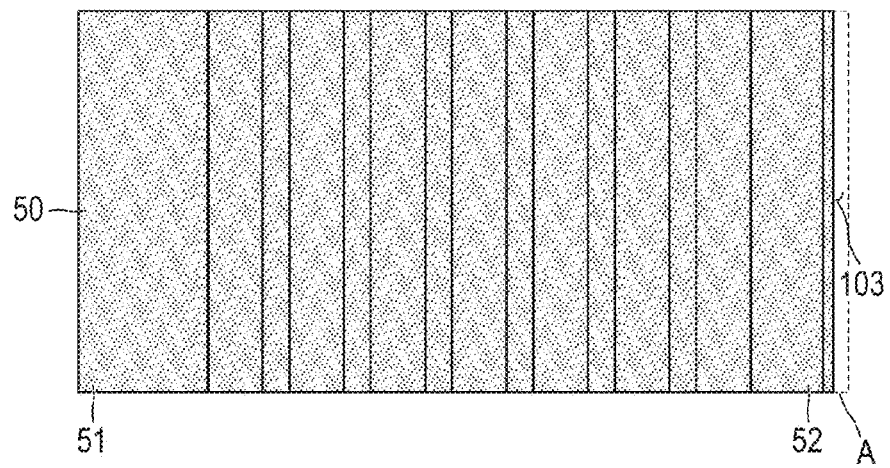
FIG. 7 illustrates an enlarged section A of the semiconductor device of FIG. 5, wherein there is only one second segment, and wherein that only one second segment is formed as a simply-connected layer which overlays and electrically interconnects the number of N1 first segments.

According to an alternative embodiment illustrated in FIG. 7, there is only one second segment 50 that is electrically connected to each of the first segments 40. Thereby, the second segment 50 may be formed as a simply-connected layer that overlays all first segments 40.

Figure 8:
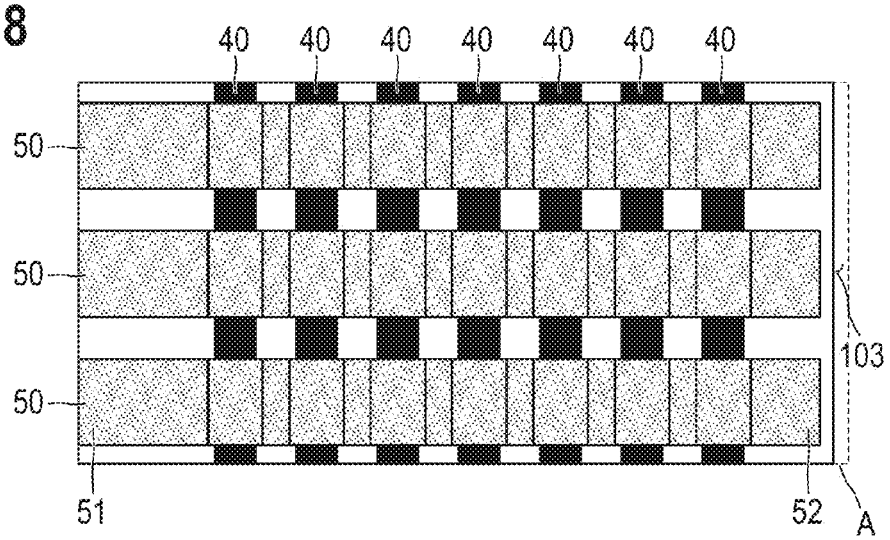
FIG. 8 illustrates an enlarged section A of the semiconductor device of FiIG. 5, wherein each of the second segments is formed as a longish stripe that overlays and electrically interconnects at least three of the number of N1 first segments.

According to a further alternative embodiment illustrated in FIG. 8, there may be a plurality of second segments 50 each forming a longish strip that electrically interconnects at least three first segments 40.

Figure 9:
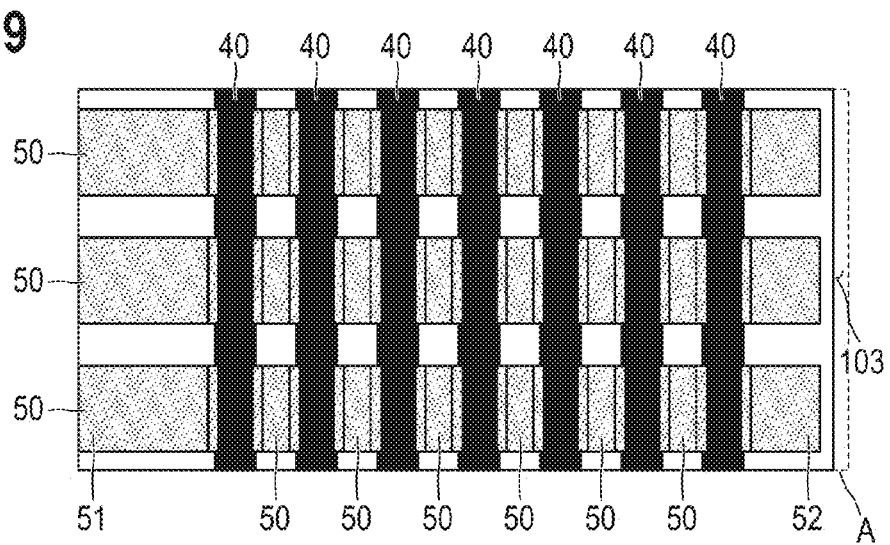
FIG. 9 illustrates an enlarged section A of the semiconductor device of FIG 5, wherein each of the second segments electrically interconnects only two of the number of N1 first segments.

According to still a further alternative embodiment illustrated in FIG. 9, there may be a plurality of second segments 50 forming a web and each electrically interconnecting only two adjacent first segments 40.

As illustrated by way of example with reference to FIGS. 8 and 9, the shielding structure may optionally form a web or a grid. Such a web or grid may be regular or irregular.

Figure 10:
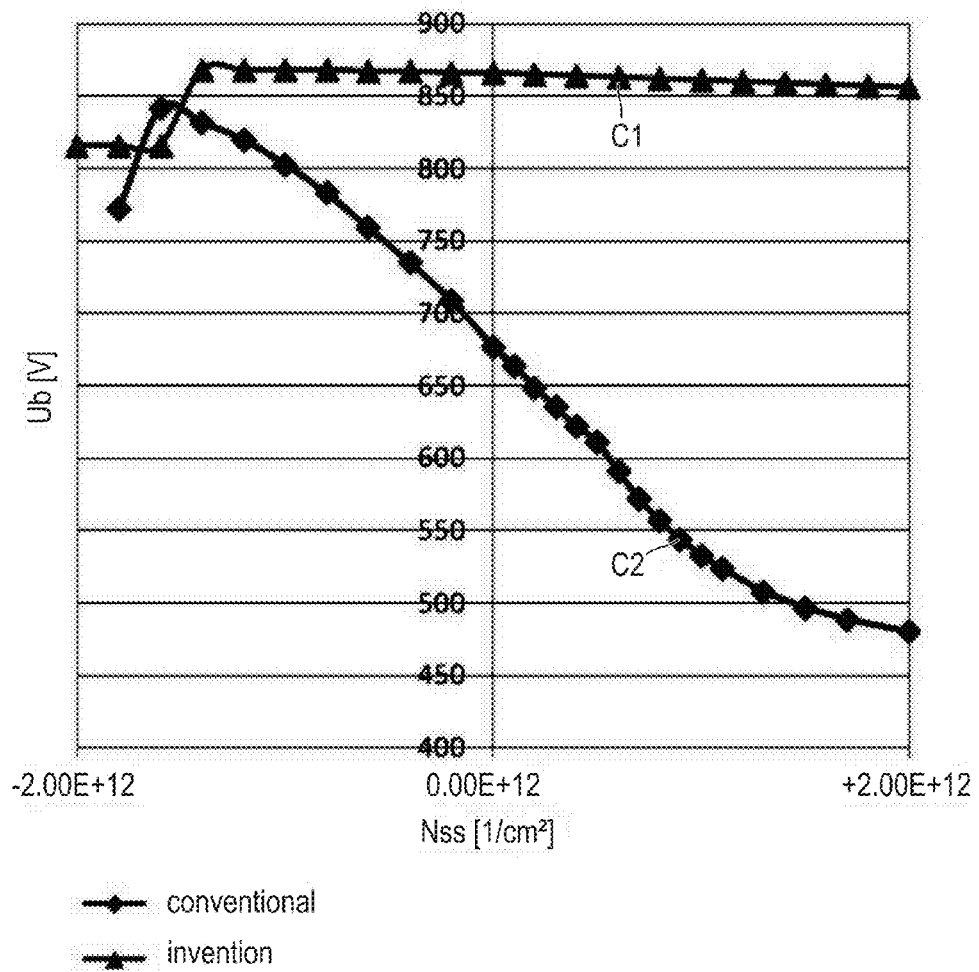
FIG. 10 is a diagram showing the influence of surface or interface charges on the blocking voltage capability and comparing a semiconductor device according to the present invention with a conventional semiconductor device that is, except for the missing shielding structure, identical to the semiconductor device according to the present invention.

FIG. 10 is a diagram showing the influence of surface charges on the blocking voltage capability and comparing a semiconductor device according to the present invention with a conventional semiconductor device that is, except for the missing shielding structure, identical to the semiconductor device according to the present invention. Curve C1 relates to the semiconductor device 1 of the invention, curve C2 to the conventional semiconductor device.

The axis of abscissa shows the surface or interface charge carrier density of charge carriers that impinge on the semiconductor device during operation of the device, and the axis of ordinate shows the blocking voltage capability Ub in Volts dependent on the surface or interface charge carrier density. The origin of these charges might be outside the semiconductor device, the material of the package of the semiconductor device, the passivation layers on top of the semiconductor device, or a degradation mechanism of one of the materials. The charges move towards the semiconductor surface due to the electric field present during operation. The charges or parts of the charges might penetrate the passivation layers or might be allocated at one of the surfaces or interfaces of any of the layers present on top of the semiconductor devices. These Charges are influencing the distribution of the electric field and thus might reduce the blocking voltage capability of the device during operation. The diagram is only intended to show that the invention has a favorable effect on the stability of the blocking voltage capability Vb during operation of the device.

In the previous description, the shielding structure was described to be arranged in the vertical direction v above a planar edge termination structure 20. Even if not shown in the drawings, additional materials, layers, structures etc. may be arranged between the edge termination structure 20 and the shielding structure.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned.

What is claimed is:

1. A semiconductor device, comprising:
    a semiconductor body comprising a bottom side, a top side opposite the bottom side, and a surface surrounding the semiconductor body;
    an active semiconductor region formed in the semiconductor body;
    an edge region surrounding the active semiconductor region;
    a first semiconductor zone formed in the edge region, the first semiconductor zone having a first conduction type;
    an edge termination structure formed in the edge region at the top side;
    a shielding structure arranged on a side of the edge termination structure facing away from the bottom side, the shielding structure comprising a number of N1≥2 first segments and a number of N2≥1 second segments, wherein:
        each of the first segments is electrically connected to each of the other first segments and to each of the second segments;
        each of the second segments has an electric resistivity higher than an electric resistivity of each of the first segments.

2. The semiconductor device as claimed in claim 1, wherein each of the second segments has an electric resistivity that is at least 10 times or at least 100 times higher than an electric resistivity of each of the first segments.

3. The semiconductor device as claimed in claim 1, wherein one, more than one or each of the first segments has an electric resistivity of less than 50 Ω·cm or of less than 1 Ω·cm.

4. The semiconductor device as claimed in claim 1, wherein one, more than one or each of the first segments comprises or consists of metal.

5. The semiconductor device as claimed in claim 1, wherein one, more than one or each of the first segments comprises or consists of doped or undoped polycrystalline semiconductor material.

6. The semiconductor device as claimed in claim 1, wherein one, more than one or each of the second segments has an electric resistivity of at least $10^8$ Ω·cm.

7. The semiconductor device as claimed in claim 1, wherein one, more than one or each of the second segments comprises or consists of at least one of the following materials:
    doped polycrystalline semiconductor material;
    undoped polycrystalline semiconductor material;
    amorphous semiconductor material; and
    amorphous non-semiconductor material.

8. The semiconductor device as claimed in claim 7, wherein the amorphous semiconductor material is amorphous silicon (a-Si) or amorphous silicon carbide (a-SiC).

9. The semiconductor device as claimed in claim 7, wherein the amorphous non-semiconductor material is amorphous carbon (a-C) or hydrogenated amorphous Carbon (a-C:H).

10. The semiconductor device as claimed in claim 1, wherein one, more than one or each of the first segments is arranged distant from the semiconductor body.

11. The semiconductor device as claimed in claim 1, wherein one, more than one or each of the first segments is formed as a closed ring.

12. The semiconductor device as claimed in claim 1, wherein among all first segments which are formed as closed rings there is only one that does not surround at least one of the other closed rings.

13. The semiconductor device as claimed in claim 1, wherein N2=1.

14. The semiconductor device as claimed in claim 13, wherein the only one second segment is a continuous layer.

15. The semiconductor device as claimed in claim 1, wherein the first segments and the second segments together form a web.

16. The semiconductor device as claimed in claim 1, further comprising
    a first main electrode, a second main electrode, and a rectifying main junction electrically connected in series between the first main electrode and the second main electrode, the rectifying main junction being arranged in the active semiconductor region.

17. The semiconductor device as claimed in claim 16, wherein the shielding structure is electrically connected to the first main electrode.

18. The semiconductor device as claimed in claim 17, wherein for each of the first segments, an electric resistance between that first segment and the first main electrode is at least 1 Ω.

19. The semiconductor device as claimed in claim 16, wherein the first main electrode is arranged on the top side and the second main electrode is arranged on the bottom side such that the semiconductor body is arranged between the first main electrode and the second main electrode.

20. The semiconductor device as claimed in claim 16, wherein the edge termination structure is arranged between the rectifying main junction and the surface.

21. The semiconductor device as claimed in claim 1, further comprising a field stop or a channel stop ring arranged in the edge region and surrounding the active semiconductor region, wherein the shielding structure is electrically connected to the field stop ring.

22. The semiconductor device as claimed in claim 21, wherein for each of the first segments, an electric resistance between that first segment and the field or channel stop ring is at least 1 Ω.

23. The semiconductor device as claimed in claim 1, wherein the edge termination structure is a planar edge termination structure.

24. The semiconductor device as claimed in claim 1, wherein the edge termination structure comprises at least one of:
 a plurality of field rings arranged distant from one another and having a second conduction type complementary to the first conduction type, each of the field rings surrounding the active semiconductor region;
 a junction termination extension region having a second conduction type (p) complementary to the first conduction type;
 a variable lateral doping region having a second conduction type complementary to the first conduction type;
 a plurality of field plates arranged distant from one another, each of the field plates surrounding the active semiconductor region; and
 a resurf region having a second conduction type complementary to the first conduction type.

25. The semiconductor device as claimed in claim 1, wherein:
 each of a plurality of first segments forms a field plate;
 the field plates are arranged distant from one another;
 each of the field plates surrounds the active semiconductor region; and
 the first segments of the shielding structure are built by the field plates.

* * * * *